(12) United States Patent
Bock et al.

(10) Patent No.: US 7,105,415 B2
(45) Date of Patent: Sep. 12, 2006

(54) METHOD FOR THE PRODUCTION OF A BIPOLAR TRANSISTOR

(75) Inventors: Josef Bock, Munich (DE); Thomas Meister, Taufkirchen (DE); Reinhard Stengl, Stadtbergen (DE); Herbert Schafer, Hohenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/153,062

(22) Filed: Jun. 15, 2005

(65) Prior Publication Data

US 2005/0233536 A1    Oct. 20, 2005

Related U.S. Application Data

(63) Continuation of application No. PCT/EP2004/003125, filed on Mar. 24, 2004.

(51) Int. Cl.
*H01L 21/8222* (2006.01)

(52) U.S. Cl. .............. 438/309; 438/366; 438/368; 438/378

(58) Field of Classification Search ......... 438/309–378
See application file for complete search history.

(56) References Cited

U.S. PATENT DOCUMENTS

| 5,266,504 | A |  | 11/1993 | Blouse et al. |
| 5,432,104 | A |  | 7/1995 | Sato |
| 6,177,717 | B1 |  | 1/2001 | Chantre et al. |
| 6,180,478 | B1 | * | 1/2001 | Lee et al. ............... 438/309 |
| 6,368,946 | B1 |  | 4/2002 | Dekker et al. |
| 6,406,966 | B1 |  | 6/2002 | Naem |
| 6,541,336 | B1 |  | 4/2003 | Cantell et al. |

FOREIGN PATENT DOCUMENTS

| DE | 19940278 | 3/2001 |
| WO | WO 98/26457 | 6/1998 |
| WO | WO 02/061843 | 8/2002 |
| WO | WO 03/046947 | 6/2003 |

OTHER PUBLICATIONS

Abdul-Rahim et al. "Improved Control of Polysilicon Emitter Interfacial Oxide Using a UHV-Compatible LPCVD Cluster Tool," *IEEE Workshop on High Performance Electron Devices for Microwave and Optoelectronic Applications*, pp. 232-234, Nov. 1997.

(Continued)

*Primary Examiner*—H. Jey Tsai
(74) *Attorney, Agent, or Firm*—Jenkins, Wilson, Taylor & Hunt, P.A.

(57) ABSTRACT

The invention relates to a method for producing a bipolar transistor. A semiconductor substrate is provided that encompasses a collector area of a first conductivity type, which is embedded therein and is bare towards the top. A monocrystalline base area is provided and a base-connecting area of the second conductivity type is provided above the base area. An insulating area is provided above the base-connecting area and a window is formed in the insulating area and the base-connecting area so as to at least partly expose the base area. An insulating sidewall spacer is provided in the window in order to insulate the base-connecting area. An emitter layer which forms a monocrystalline emitter area above the base area and a polycrystalline emitter area above the insulating area and the sidewall spacer is differentially deposited and structured, and a tempering step is carried out.

10 Claims, 17 Drawing Sheets

OTHER PUBLICATIONS

Jouan et al., "A High-Speed Low 1/f Noise SiGe HBT Technology Using Epitaxially-Aligned Polysilicon Emitters," *IEEE Transactions on Electron Devices*, vol. 46, No. 7, pp. 1525-1531, Jul. 1999.

King et al., "Very Low Cost Graded SiGe Base Bipolar Transistors for a High Performance Modular BiCMOS Process," *IEDM Technical Digest*, pp. 565-568, 1999.

Meister et al., "SiGe Base Bipolar Technology with 74 GHz $f_{max}$ and 11 ps Gate Delay," *IEDM Technical Digest*, pp. 739-742, 1995.

* cited by examiner

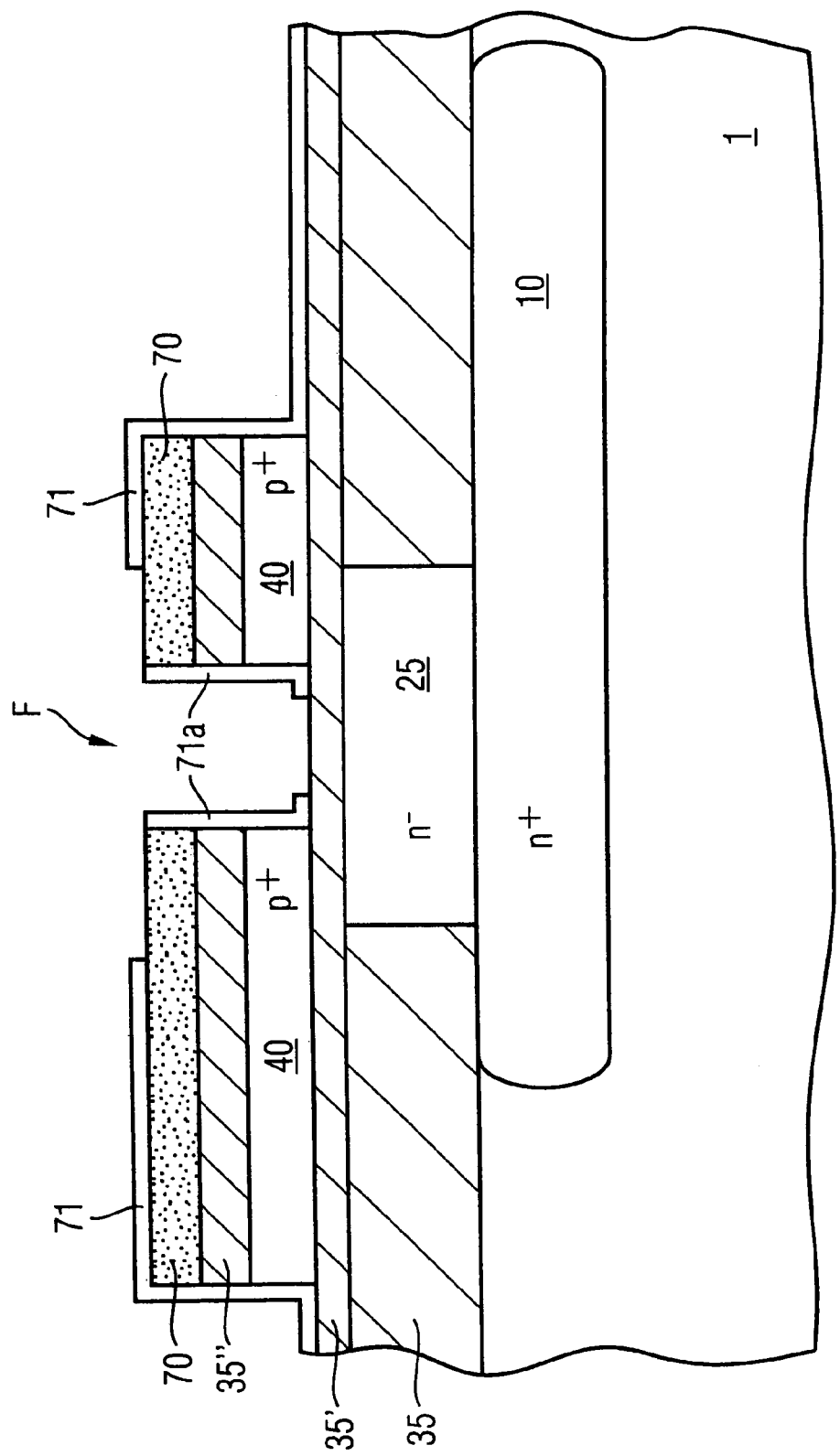

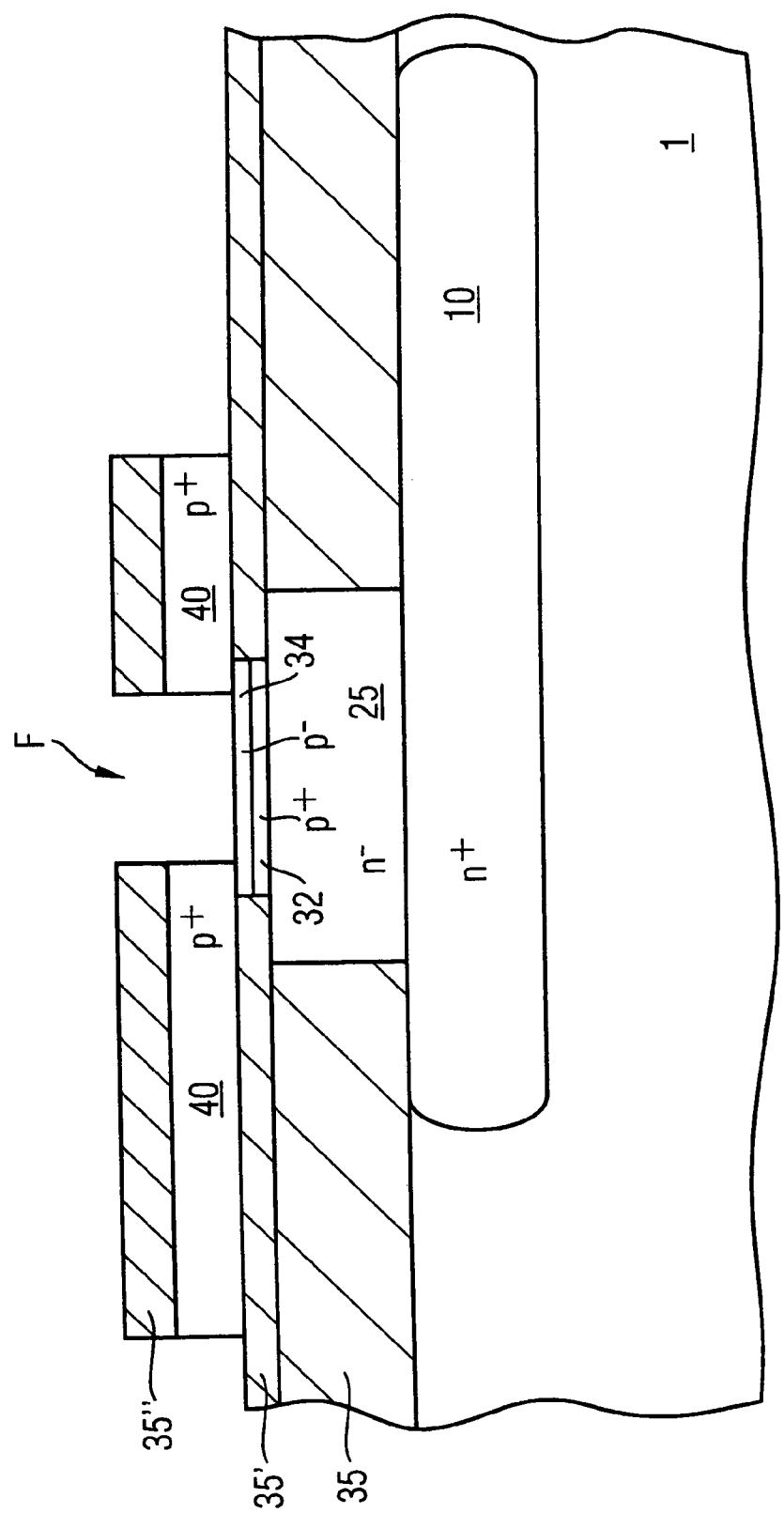

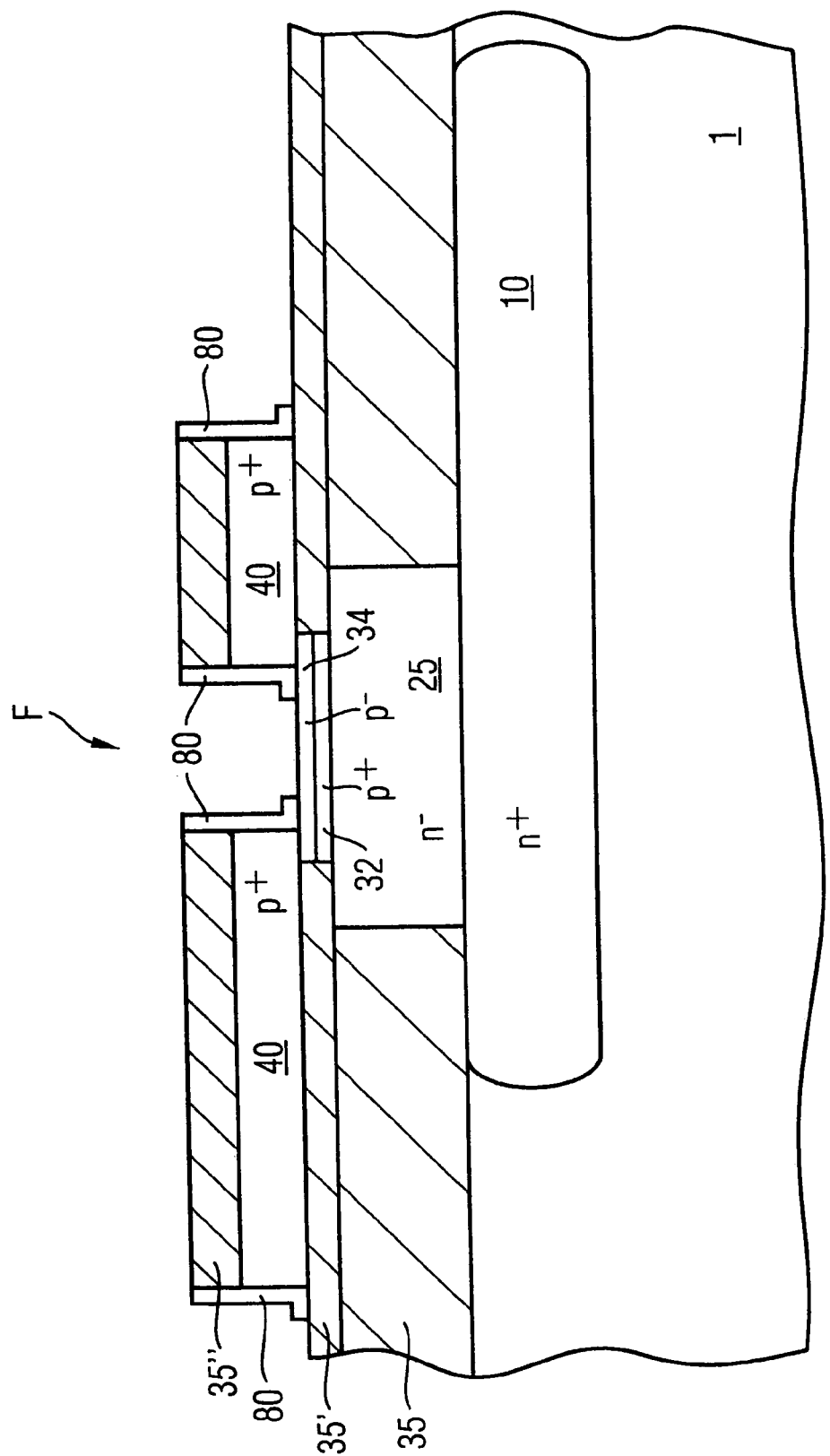

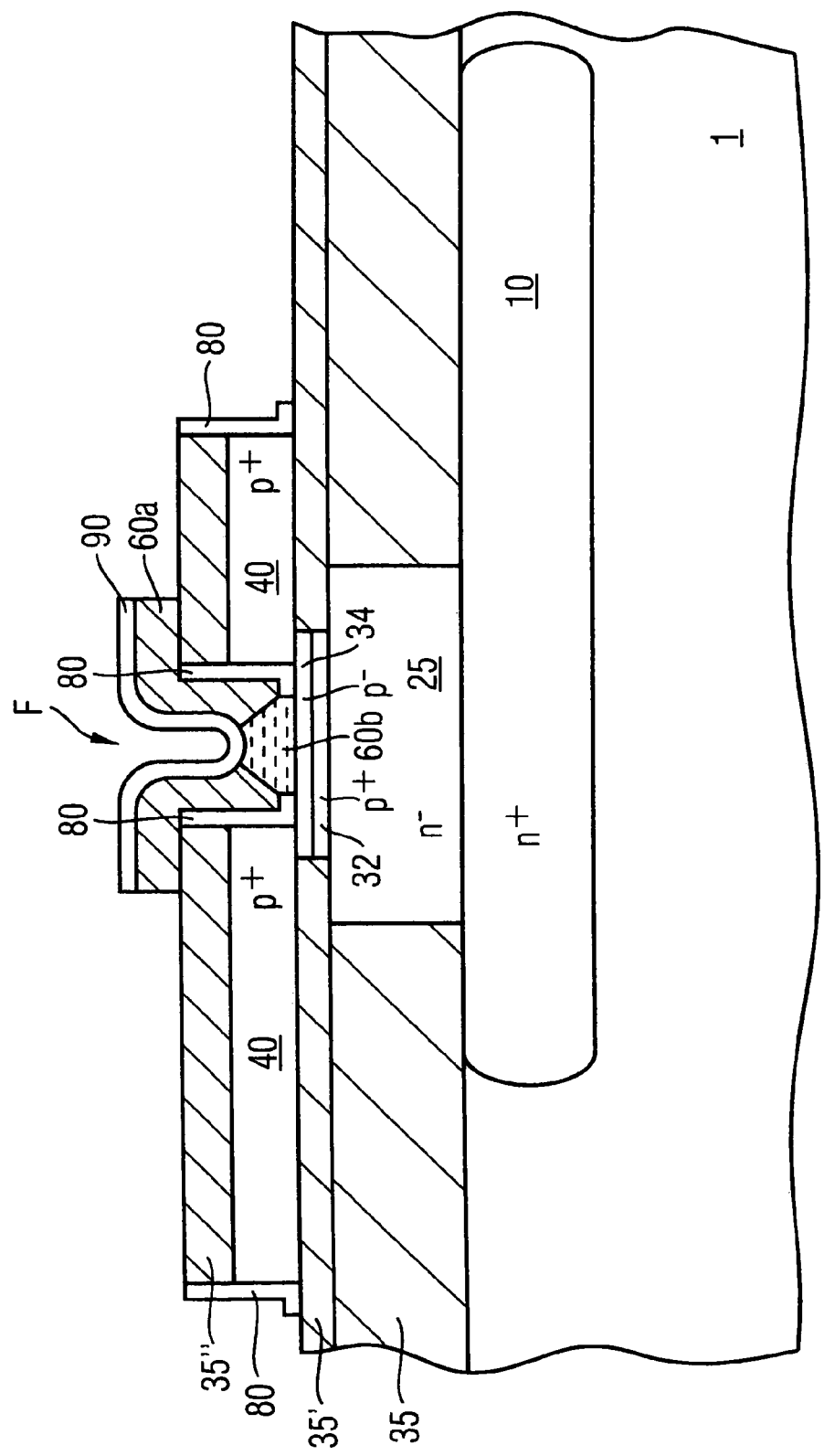

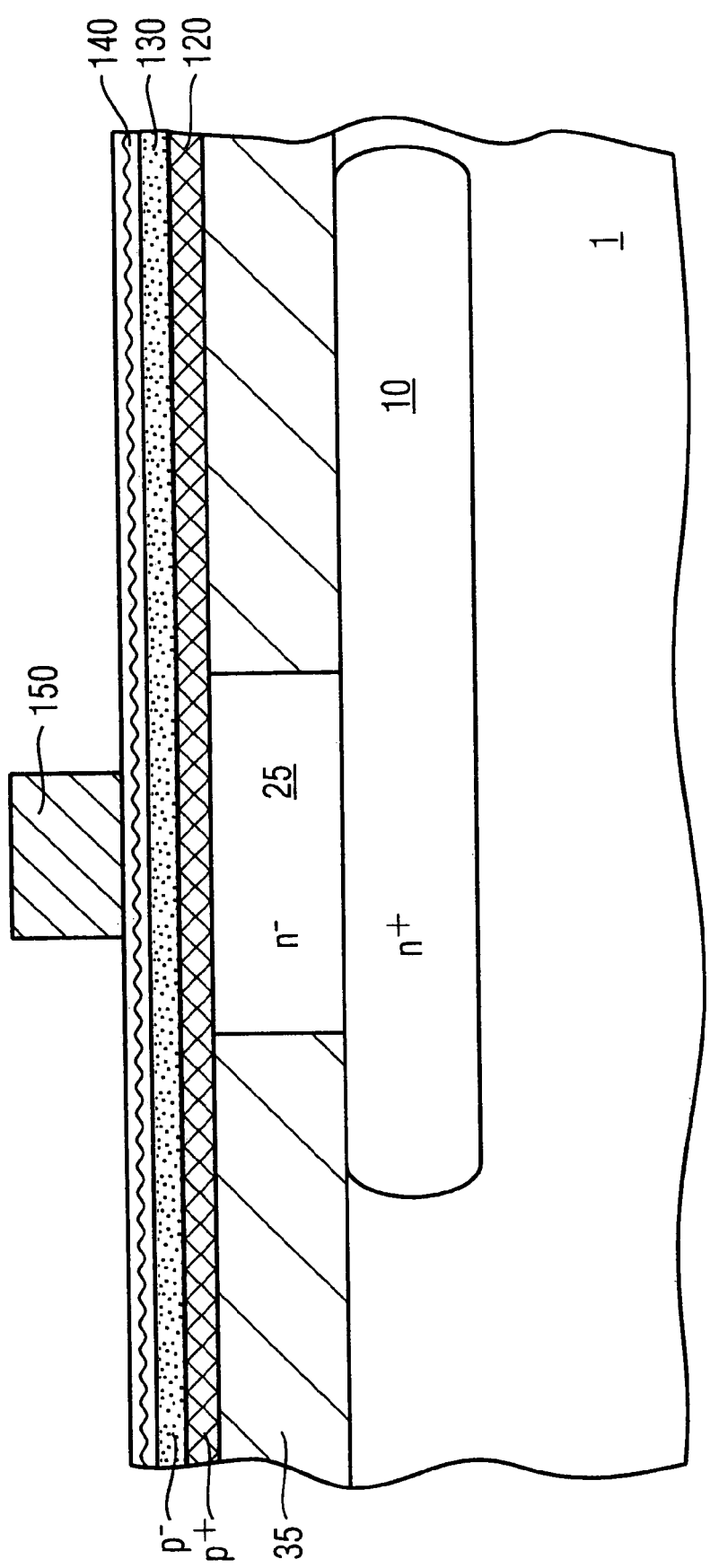

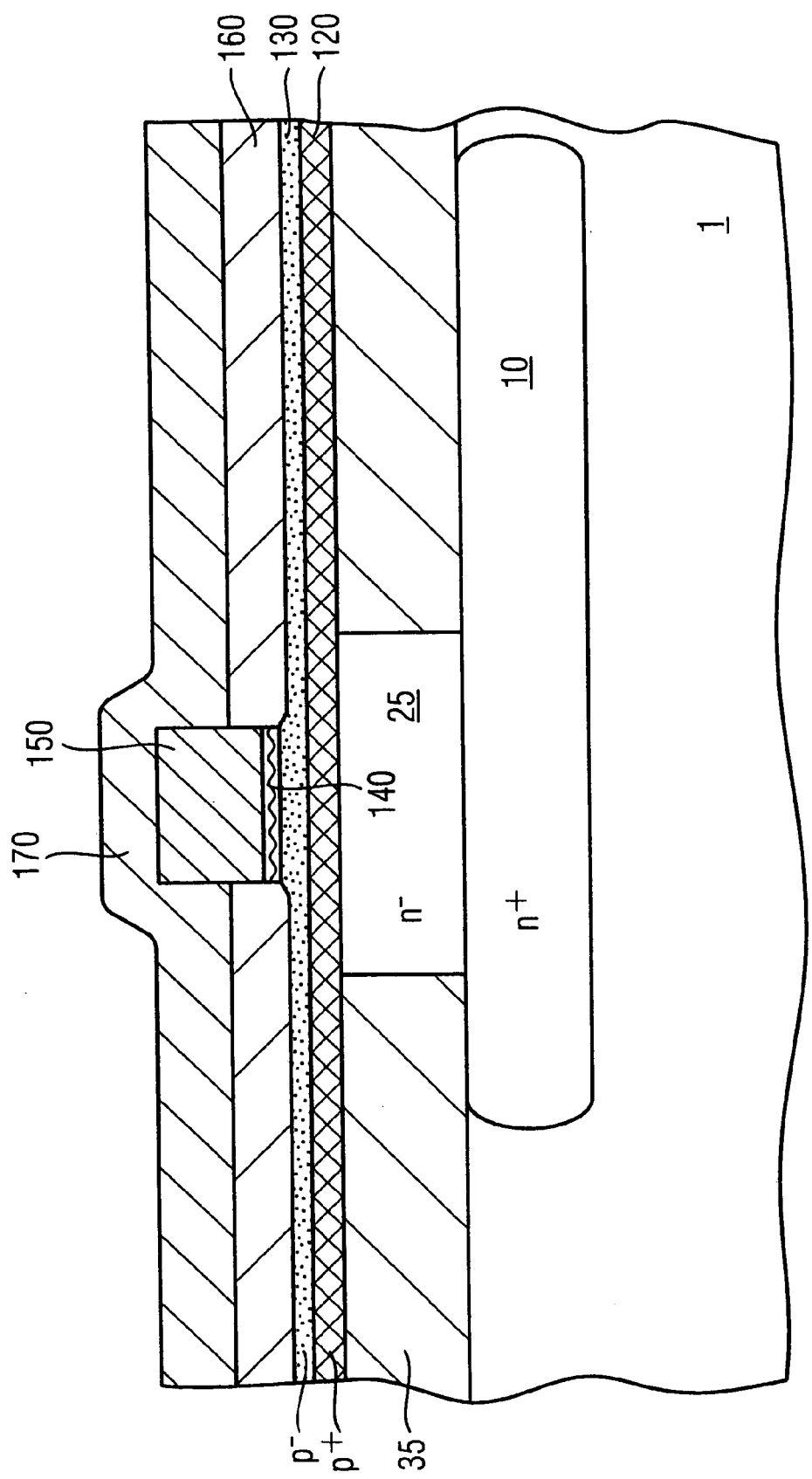

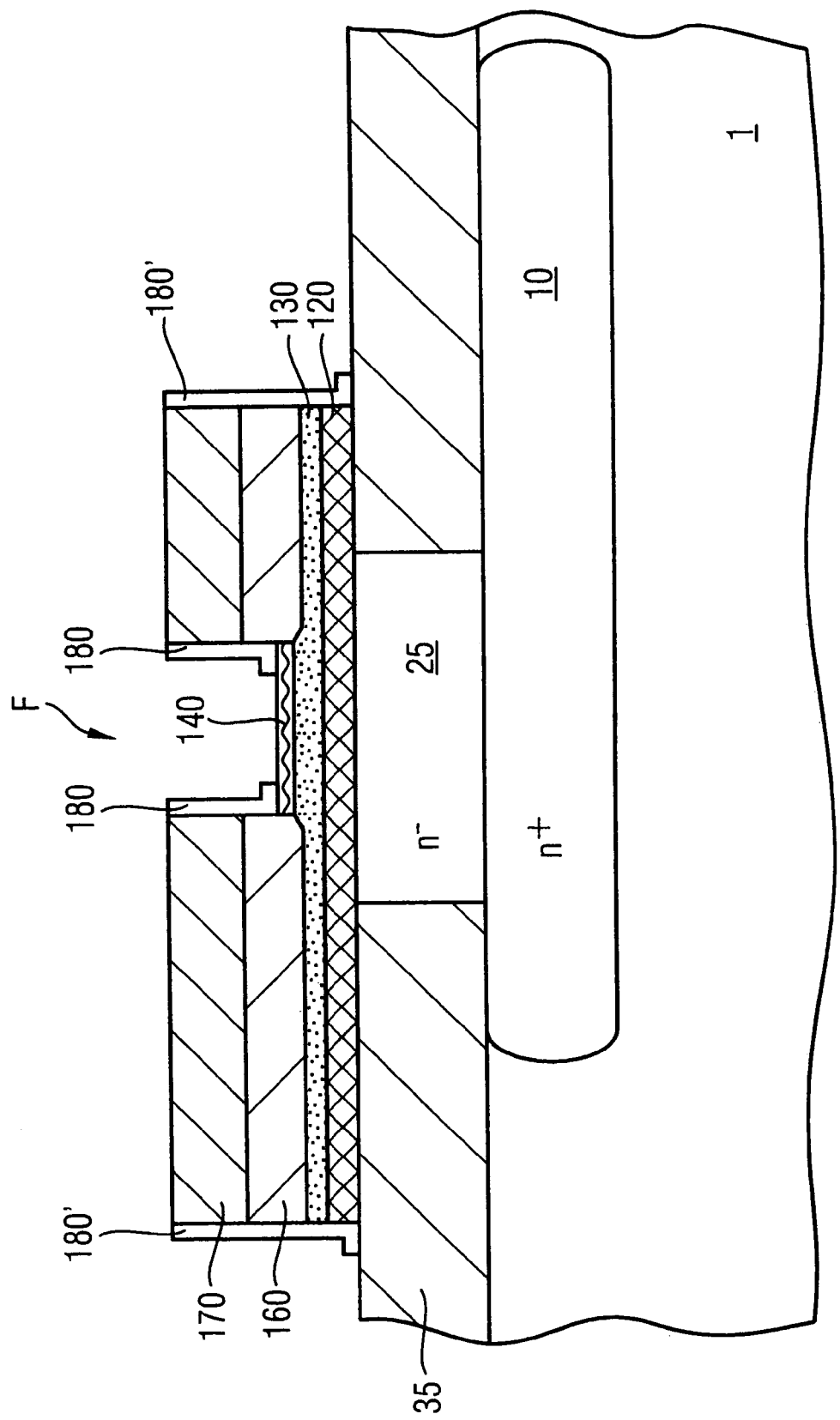

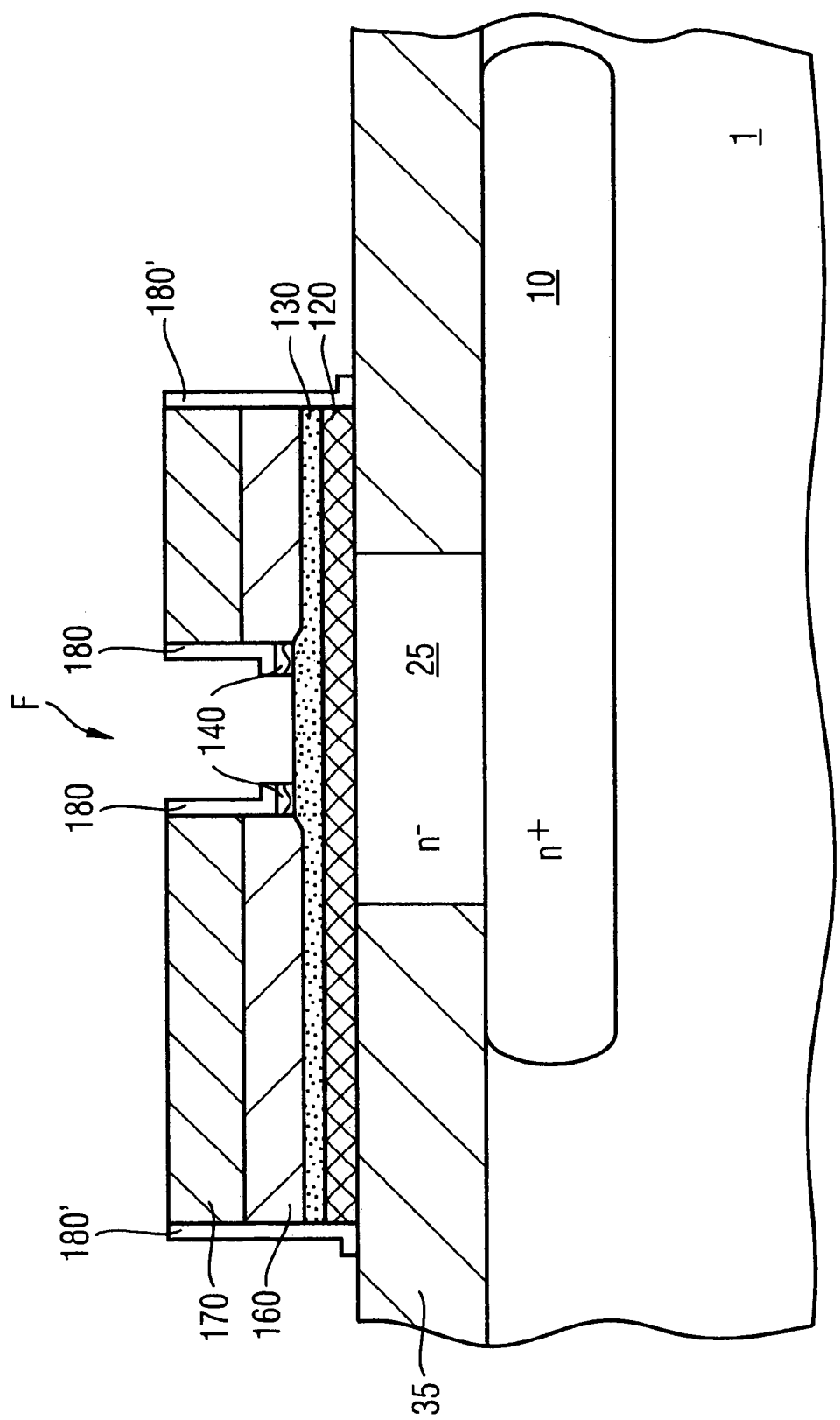

METHOD FOR THE PRODUCTION OF A BIPOLAR TRANSISTOR

RELATED APPLICATIONS

This application is a continuation of PCT patent application number PCT/EP2004/003125, filed Mar. 24, 2004, which claims priority to German patent application number 10317098.7, filed Apr. 14, 2003, the disclosures of each of which are incorporated herein by reference in their entirety.

TECHNICAL FIELD

The present invention relates to a method for the production of a bipolar transistor.

BACKGROUND ART

Although applicable in principle to arbitrary bipolar transistors, the present invention and the problem area on which it is based will be explained with regard to DPSA transistors.

DPSA (double polysilicon self-aligned) transistors, as disclosed e.g. in T. F. Meister et al., IEDM Technical Digest 1995, pp. 739–741, use, as $p^+$-type base terminal and as $n^+$-type emitter contact, $p^+$-type polysilicon and respectively $n^+$-type polysilicon layers that are especially deposited therefor. In this case, in the emitter window, the $n^+$-type polysilicon emitter layer is insulated from the $p^+$-type polysilicon layer of the base terminal by a spacer in a self-aligned manner. On account of its lateral and vertical scalability and the small parasitic capacitance and resistance components, the DPSA transistor structure is best suited to very high speed applications. In this case, the DPSA transistor may contain both an implanted Si base and an epitaxially deposited SiGe base.

FIG. 4 is a schematic illustration of a known DPSA transistor as disclosed in T. F. Meister et al., IEDM Technical Digest 1995, pp. 739–741.

In FIG. 4, reference symbol 1 designates a silicon semiconductor substrate, 10 designates an $n^+$-type subcollector region in the form of a buried layer, 20 designates $p^+$-type channel blocking regions, 25 designates an $n^-$-type collector region, 30 designates a p-type base region, 35 designates a CVD insulation oxide layer, 15 designates a LOCOS insulation oxide layer, 40 designates a $p^+$-type base terminal, 45 designates an $n^+$-type collector contact, 55 designates a double spacer comprising silicon oxide/silicon nitride, and 50 designates an $n^+$-type emitter contact.

FIGS. 5a–c are schematic illustrations of the method steps with regard to the emitter contact of a customary method for the production of a DPSA transistor, in contrast to FIG. 1 reference symbol 55' designating a single spacer made of oxide. Reference symbol F designates the emitter window in the layers 35 and 40.

In order to produce the $n^+$-type emitter contact, in the case of the DPSA transistor, after the formation of the oxide spacer 55' covering the sidewalls of the emitter window F, on the active $p^+$-type base region, an $n^+$-doped (implanted or in situ doped) $n^+$-type polysilicon layer 60 is applied in polycrystalline fashion on the active transistor zone and also on the surrounding insulation regions.

Afterward, the $n^+$-type polysilicon layer 60 is patterned anisotropically by means of a phototechnology for the purpose of forming the final emitter contact 60 and the $n^+$-type dopant is driven e.g. 20 nm into the underlying monocrystalline Si material of the base region 30 by means of a thermal step (FIG. 5c). This gives rise to an $n^+$-type emitter composed of a monocrystalline portion 31 and a polycrystalline portion 50.

In this production method, a natural oxide film 36 of 0.5–2 nm forms in the time between spacer etching and $n^+$-type polysilicon emitter deposition on the active transistor zone between the monocrystalline and polycrystalline parts of the emitter. The thickness of said natural oxide layer 36, which can be controlled only with extreme difficulty, influences both the current gain appreciably and the emitter resistance of the DPSA transistor.

In the case of DPSA transistors having an implanted Si base, the natural interface oxide 36 was necessary in order to achieve a sufficiently high current gain. By contrast, in the case of an integrated SiGe base, the natural oxide layer 36 is no longer necessary since such DPSA transistors already achieve sufficiently high current gains solely on account of the Ge content in the base. Moreover, with increasing lateral scaling of the emitter window F in these DPSA transistors, the rise in the emitter resistance becomes apparent in a disadvantageous manner to an ever greater extent. This is because this rise in the emitter resistance leads to a significant reduction in the limiting frequency and nowadays limits the lateral scalability of the DPSA transistor.

This is caused by said natural interface oxide 36 in the poly/mono intermediate layer of the $n^+$-type emitter and also the limited conductivity of the $n^+$-type polysilicon layer in the narrow emitter window F of the DPSA transistor.

On the other hand, SiGe bipolar transistor structures that deviate from the DPSA transistor are known, in the case of which the integrated $n^+$-type emitter is entirely monocrystalline (see H. U. Schreiber et al., Electronic Letters 1989, Vol. 25, pp. 185–186).

Thus, in accordance with H. U. Schreiber et al., loc. cit., a so-called double mesa transistor is described, for the production of which firstly the $n^-$-doped collector, the SiGe base, an $n^-$-doped epitaxial emitter and an $n^+$-doped monocrystalline emitter cap are applied on a bare Si wafer in a single epitaxy step. Afterward, the applied epitaxial layers are patterned and suitably contact-connected by means of a metallization. In comparison with the DPSA transistor, the double mesa transistor has significantly larger lateral dimensions that limit the circuit performance of this transistor structure. Thus, by way of example, in this transistor structure, the lateral, effective emitter width must always be larger than the contact hole that makes contact with the emitter.

Equally, in accordance with U.S. Pat. No. 6,177,717 B1 a single-poly (SP) transistor is described, in which the $n^+$-doped emitter region is deposited onto the SiGe base in monocrystalline fashion in a CVD reactor. Such SP transistors also have significant disadvantages in comparison with the DPSA transistor structure. By way of example, the additional $p^+$-type polysilicon deposition (thickness approximately 100–200 nm) is absent, this deposition being carried out in the case of the DPSA transistor for the purpose of reducing the base contact resistance. Therefore, although the SP transistor has a more planar topology in the emitter window, it also requires a $p^+$-type implantation into the monocrystalline SiGe base terminal zone after the SiGe base deposition in order to improve the base bulk resistance. Said $p^+$-type implantation produces point defects which, during the subsequent process steps, diffuse into the nearby active base, where they lead to a significant widening of the vertical base profile and thus to a significant reduction of the limiting frequency. In this planar transistor structure, the $n^+$-type emitter deposited in monocrystalline fashion (in comparison with the n+-type poly/mono emitter) was introduced in order to improve the low-frequency noise.

It is an object of the invention to specify an improved method for the production of a bipolar transistor, in which case the emitter resistance can be kept as low as possible.

This object is achieved by means of a method of a bipolar transistor according to claim 1.

The present invention provides a production method for a bipolar transistor in which both the poly/mono Si boundary layer and the natural oxide film contained therein are no longer present, so that it is possible to produce transistors with the smallest possible emitter resistance.

The subclaims relate to preferred developments.

In accordance with one preferred development, carbon is incorporated into the emitter layer. A later outdiffusion of the base layer can thus be prevented.

In accordance with a further preferred development, the heat treatment step is a rapid annealing step, preferably a lamp annealing step.

In accordance with a further preferred development, a second insulation region is provided between the collector region and the base terminal region, and is opened by means of a wet-chemical etching in the window before the base region is formed selectively in the emitter window on the collector region.

In accordance with a further preferred development, the base region is deposited over the whole area of the semiconductor substrate with a collector region embedded therein, said collector region being bare toward the top, a mask region is formed above the base region in accordance with the later emitter window, said mask region being embedded in the base terminal region and the overlying first insulation region, after which the window is formed.

In accordance with a further preferred development, the base terminal region is grown above the base region by means of selective epitaxy in a manner doped in situ.

In accordance with a further preferred development, the mask region has an oxide layer and an overlying nitride layer, the nitride layer is removed during the formation of the window, the first sidewall spacer is formed in the window on the oxide layer, and then the oxide layer is opened by means of a wet-chemical etching.

In accordance with a further preferred development, the base region has a lower, more highly doped first base foundation layer and an upper, more lightly doped base cap layer, above which the base terminal region is provided, the base cap layer being doped upward during the heat treatment step from the base terminal region.

In accordance with a further preferred development, the base cap layer is thinned after the formation of the mask region. This ensures reliable upward doping.

In accordance with a further preferred development, the removal of the natural oxide in the uncovered base region takes place in an epitaxy reactor by means of a heat treatment in a hydrogen atmosphere and the differential deposition of the emitter layer is subsequently carried out in situ in the epitaxy reactor.

The invention is explained in more detail below on the basis of exemplary embodiments with reference to the drawings.

BRIEF DESCRIPTION OF THE DRAWINGS

FIGS. 2a–g show schematic illustrations of the method steps of a second embodiment according to the invention of the method for the production of a DPSA transistor;

FIGS. 3a–g show schematic illustrations of the method steps of a third embodiment according to the invention of the method for the production of a DPSA transistor;

DETAILED DESCRIPTION OF THE INVENTION

In the figures, identical reference symbols designate identical or identically acting elements.

Figure 1A:
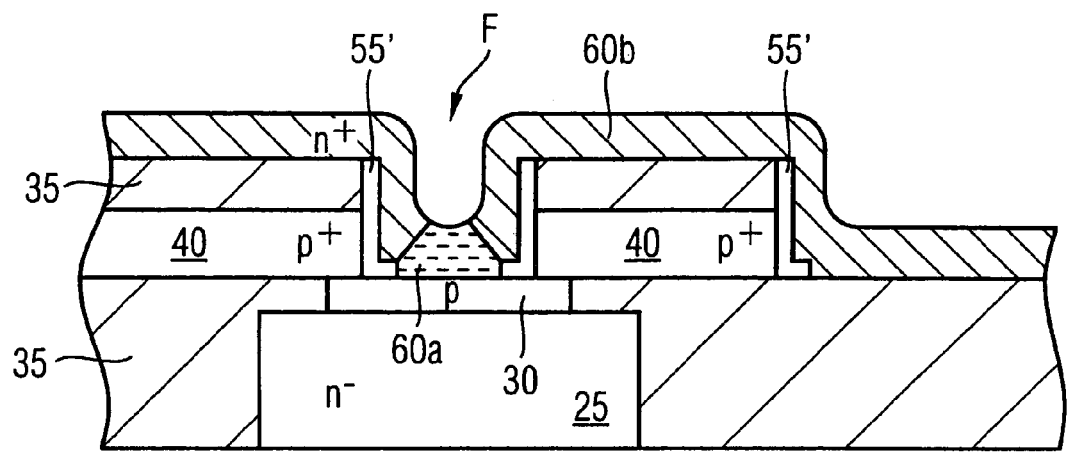
FIGS. 1a, b show schematic illustrations of the method steps with regard to the emitter contact of a first embodiment according to the invention of the method for the production of a DPSA transistor.

FIGS. 1a, b are schematic illustrations of the method steps with regard to the emitter contact of a first embodiment according to the invention of the method for the production of a DPSA transistor.

In principle, a method is specified here which, in the active emitter region and the vicinity thereof, replaces the n+-type polysilicon emitter layer 60 of the DPSA transistor by a monocrystalline n+-type emitter layer 60a'.

Figure 5A:
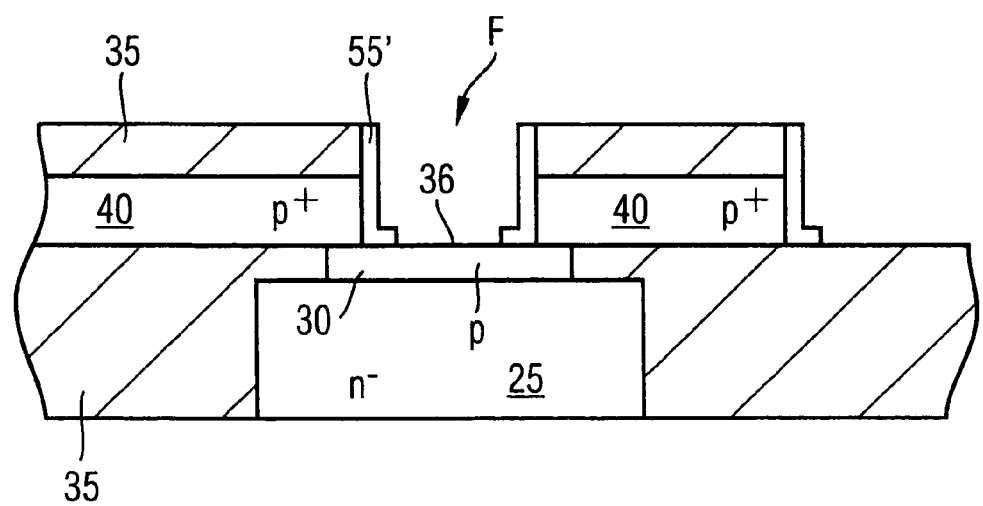
FIGS. 5a–c show schematic illustrations of the method steps with regard to the emitter contact of a customary method for the production of a DPSA transistor.
Figure 5B:
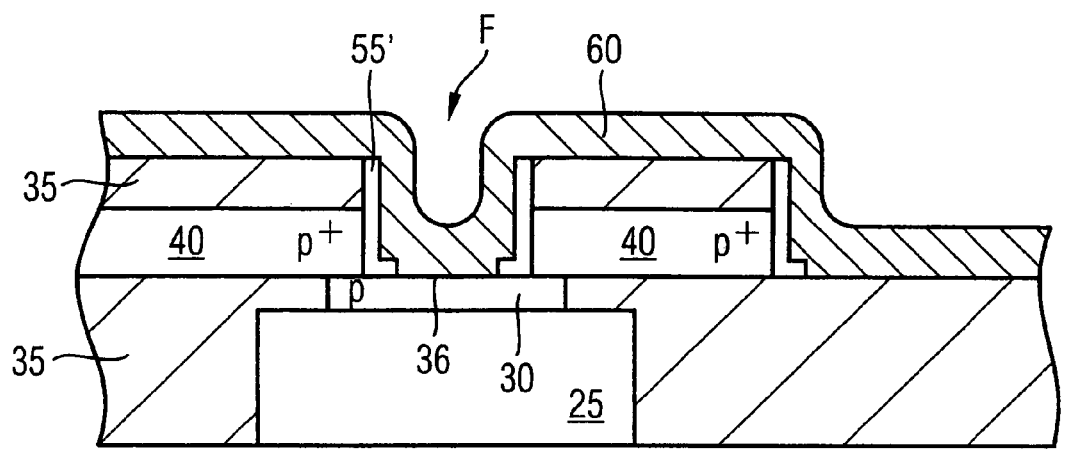
Figure 5C:
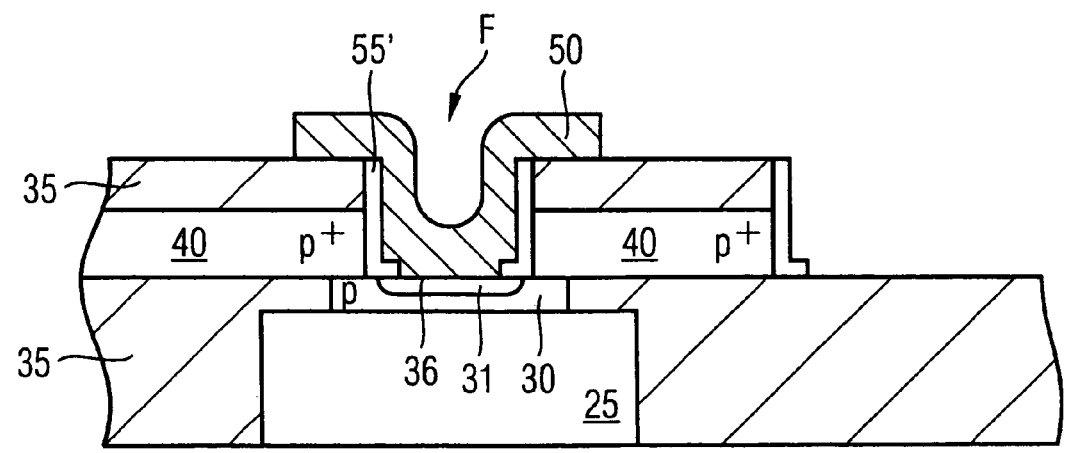

For this purpose, proceeding from the process state shown in FIG. 5a, firstly, in an ultraclean epitaxy reactor, the natural oxide film 36 on the bare silicon of the base region 30 at the bottom of the emitter window F is removed by means of a heat treatment (at least 800° C.) in an $H_2$ atmosphere. Afterward, in the epitaxy reactor, by means of differential epitaxy, the n+-doped emitter layer 60a, b is deposited over the whole area in a manner doped in situ with As or P (e.g. $1 \times 10^{20}$ cm$^{-3}$–$1 \times 10^{21}$ cm$^{-3}$). In this case, the n+-type emitter layer grows as monocrystalline emitter region 60a on the bare silicon regions and as polycrystalline emitter region 60 on the surrounding oxide regions, as illustrated in FIG. 1a. Disilane, for example, may be used as a silicon source for this low-temperature deposition (at approximately 450° C.–650° C.).

In order as far as possible to avoid an outdiffusion of the boron profile in the underlying SiGe base 30 during the subsequent thermal steps, it is possible, during this deposition of the n+-type emitter layer 60a, b, for carbon (C) also to be introduced with a concentration of $1 \times 10^{19}$ cm$^{-3}$ to $2 \times 10^{20}$ cm$^{-3}$ into the n+-doped emitter layer 60a, b. The introduced C can bind the point defects produced e.g. in highly As-doped Si layers and thus prevent them from diffusing into the SiGe base 30 and leading to an anomalously high boron diffusion there.

In particular, the introduction of C at the monocrystalline emitter is highly advantageous since the n+-type poly/mono boundary layer that represents a barrier for point defects is absent here.

Figure 1B:
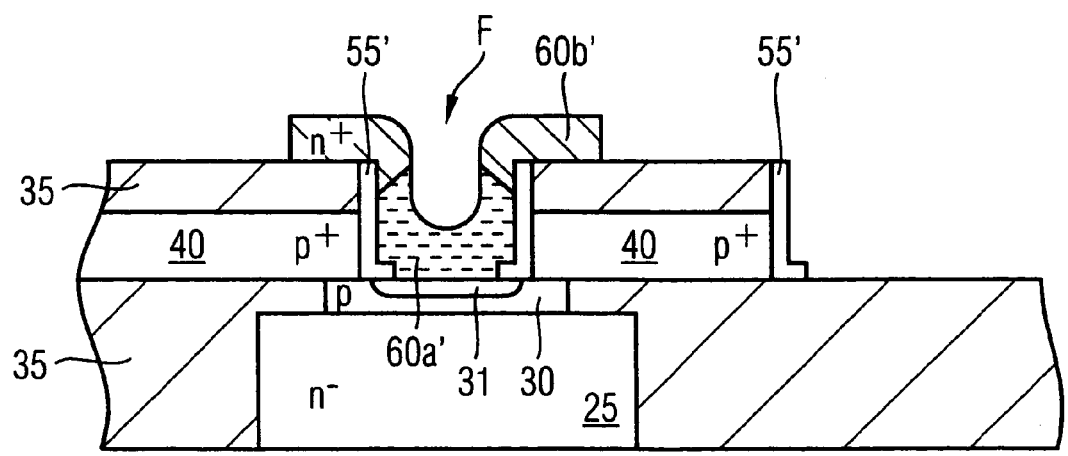

After this whole-area n+-type emitter deposition, the n+-type layer 60a, 60b is patterned in a photostep to form the final emitter contact 60a', 60b' and a short lamp annealing step (e.g. 980° C., 4 s) is carried out for activating the n+-type dopant, as shown in FIG. 1b.

During this thermal step, the n+-type dopant diffuses a few nm into the Si material of the SiGe base 30 below the applied n+-type epitaxial layer. Furthermore, this thermal step leads to a partial recrystallization of the n+-doped polycrystalline material on the sidewall regions of the emitter window F. In other words, the monocrystalline emitter region 31 is formed in a part of the earlier base region 30, and the monocrystalline emitter region 60a is enlarged to form the monocrystalline emitter region 60a', which for the most part covers the sidewall with the oxide spacer 55' of the emitter window F.

This method thus avoids a poly/monosilicon boundary layer at the bottom of the emitter window F and the interface oxide 36 present in it. For this reason, the emitter resistance of the laterally scaled DPSA transistor can be significantly reduced by this method. Furthermore, in comparison with an $n^+$-type polysilicon layer of the same thickness, the sheet resistance of the monocrystalline $n^+$-type silicon layer 60a' in the emitter is reduced by a factor of 3 or more. This is likewise highly advantageous in order to achieve a lowest possible emitter resistance in the narrow emitter window F of the DPSA transistor having an unfavorable aspect ratio.

Two exemplary embodiments of the DPSA transistor for the integration of an $n^+$-doped monocrystalline emitter according to the above method are described in detail below. They concern a DPSA transistor produced by means of selective SiGe base epitaxy and a DPSA transistor produced by means of whole-area SiGe base epitaxy.

FIGS. 2a–g are schematic illustrations of the method steps of a second embodiment according to the invention of the method for the production of a DPSA transistor.

A known production method for the DPSA transistor produced by means of selective SiGe base epitaxy is described thoroughly e.g. in DE 199 58 062 C2. The most important production steps for understanding the second embodiment, beginning with the selective base deposition, are explained here.

FIG. 2a shows the state of the DPSA transistor prior to the integration of the SiGe base. By way of example, the known shallow trench isolation is used here as insulation. In the case of this planar insulation, the $n^-$-doped collector 25 is laterally insulated by the CVD oxide regions 35. The $n^-$-doped collector 25 lies on the low-impedance, highly As-doped subcollector 10. The $n^-$-type collector 25 is covered by a CVD oxide layer 35' having a thickness of 40–80 nm. A stack comprising the $p^+$-type polysilicon base terminal 40, a further CVD oxide layer 35" and a nitride layer 70 is patterned on the CVD oxide layer 35'. The sidewalls of the emitter window F located above the $n^-$-doped collector 25 are covered by a thin nitride spacer 71a. The nitride layer 71 used for producing said spacer 71a simultaneously serves for protecting the insulation regions of the CVD oxide layer 35' that are located outside the emitter window F from the subsequent wet etching.

Figure 2B:
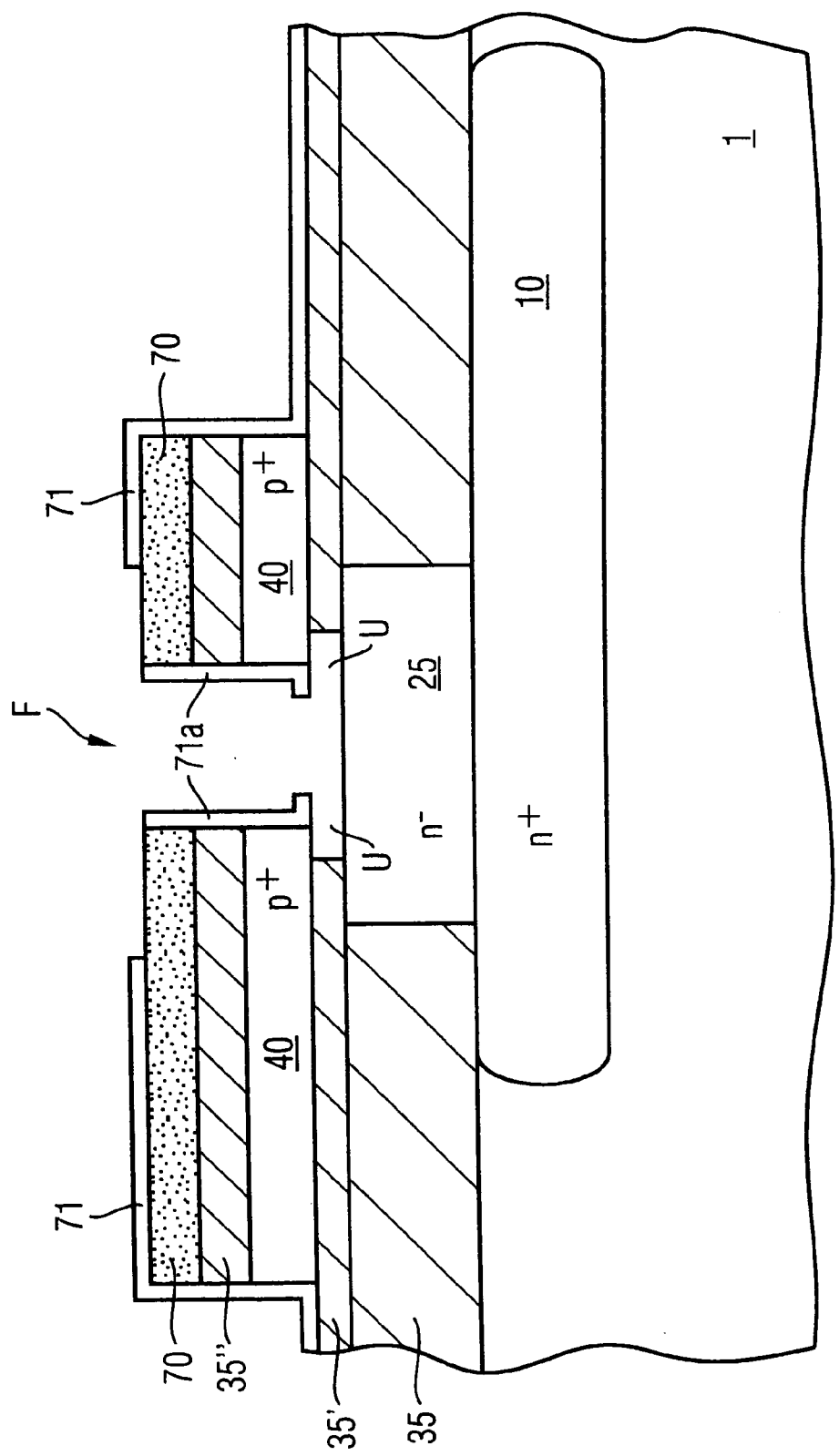

By means of this wet etching, as shown in FIG. 2b, the CVD oxide layer 35' is removed in the emitter window F selectively with respect to the surrounding nitride spacer 71a. This isotropic etching is carried out until a $p^+$-polysilicon overhang U of approximately 80 nm has arisen in self-aligned manner.

The $p^+$-doped SiGe base 32 and the lightly doped Si cap (n- or p-) 34 are deposited on the bare silicon region of the $n^-$-type collector 25 by means of selective epitaxy in a CVD reactor, as shown in FIG. 2c.

During the selective epitaxy, C ($1 \cdot 10^{18}$ cm$^{-3}$–$1 \cdot 10^{20}$ cm$^{-3}$) is also incorporated in the $p^+$-doped SiGe base in accordance with FIG. 2c in order as far as possible to avoid the diffusion of the boron atoms during the subsequent process steps. The selective deposition of the SiGe/Si layers 32, 34 is carried out until a low-impedance contact with the bare $p^+$-type polysilicon of the base terminal has been achieved. The nitride spacers 71a and the other nitride auxiliary layers 70, 71 are then removed in phosphoric acid selectively with respect to oxide and Si.

Afterward, in accordance with FIG. 2d, oxide spacers 80 are provided on the sidewalls of the emitter window F, which later insulate the $p^+$-type base terminal 40 from the $n^+$-doped emitter regions or protect the other side edges of the $p^+$-type base terminal 40 during the deposition of the $n^+$-doped emitter polysilicon.

Then, in accordance with FIG. 2e, analogously to the description given for FIGS. 1a, b, the $n^+$-doped emitter layer 60a, b is deposited over the whole area by means of differential epitaxy in a CVD reactor. In this case, the $n^+$-doped emitter layer grows as monocrystalline emitter region 60a on the bare silicon regions and as polycrystalline emitter region 60b on the oxide regions.

It is advantageous here, as stated, for C also to be incorporated with a concentration of $1 \cdot 10^{19}$ cm$^{-3}$ to $2 \cdot 10^{20}$ cm$^{-3}$ during this deposition. After this deposition, a thin nitride layer 90 of approximately 20 nm is also applied on the $n^+$-doped emitter layer 60a, b and the resulting double layer is patterned anisotropically by means of a phototechnology.

Figure 2F:
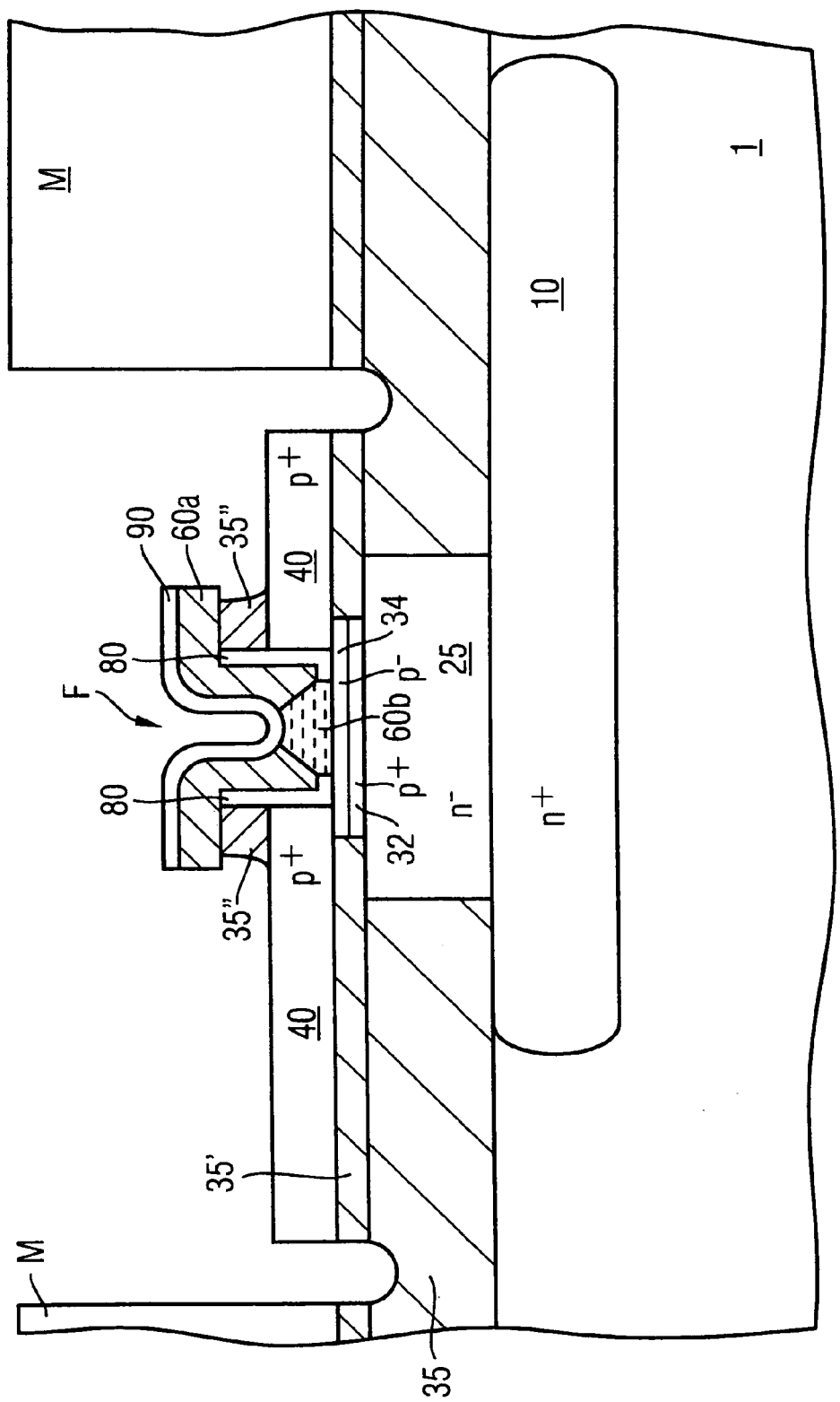

Afterward, in accordance with FIG. 2f, by means of a phototechnology, a resist mask M is provided around the $p^+$-type polysilicon terminal zone of the DPSA transistor and the CVD oxide layer 35" on the $p^+$-type polysilicon (apart from a residual region directly beside the emitter window F) of the base terminal 40 and also the oxide spacers 80 at the outer edges of the $p^+$-type polysilicon of the base terminal 40 and also corresponding regions of the CVD oxide layer 35' are removed by a wet etching. The partial zone of the CVD insulation that is not protected by the resist mask M is incipiently etched in this case.

Figure 2G:
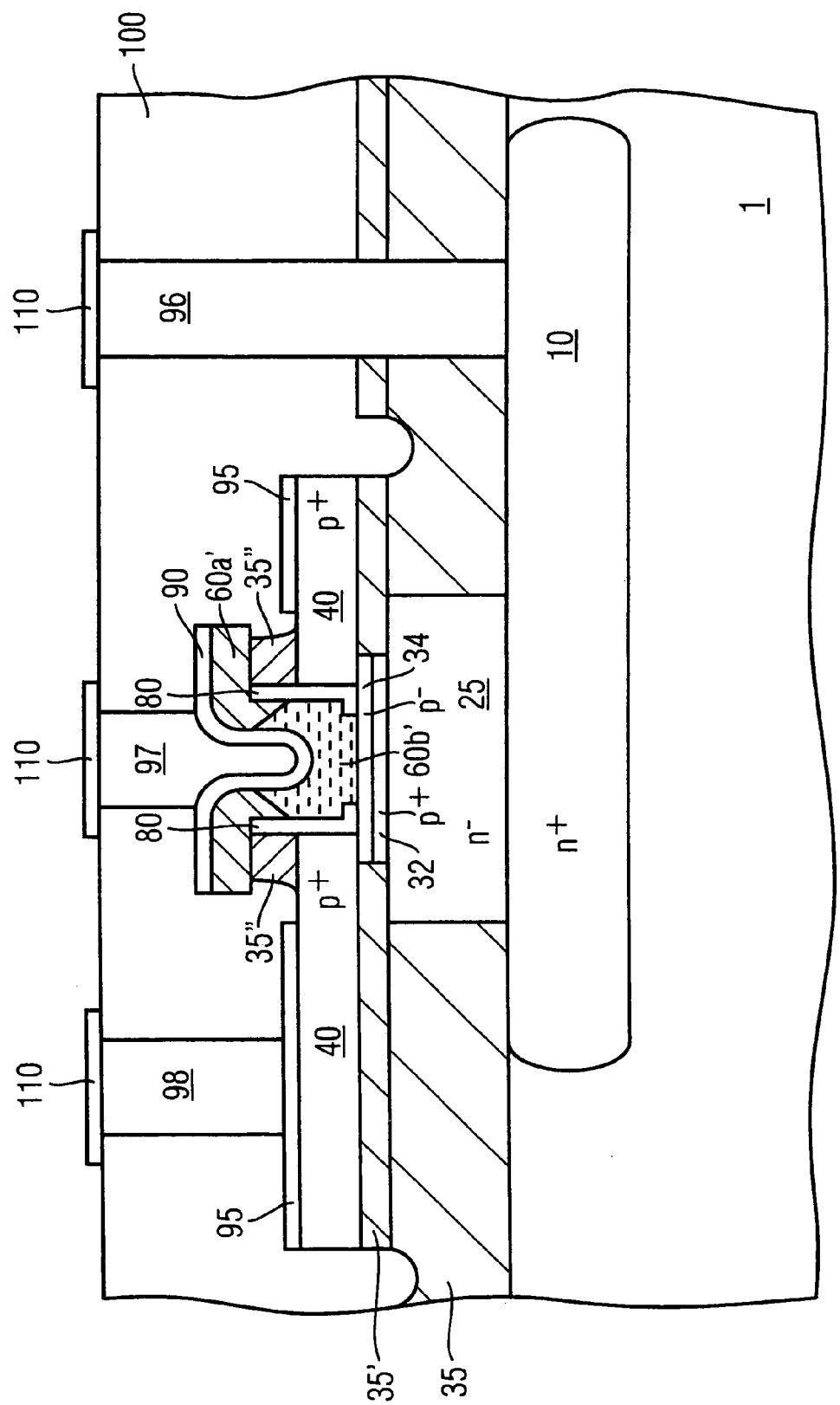

Afterward, in accordance with FIG. 2g, the mask M is removed and a silicide layer 95 is produced on the bare regions of the $p^+$-type polysilicon of the base terminal 40. An $SiO_2$ layer is then deposited and planarized by chemical mechanical polishing, thus giving rise to an intermediate oxide layer 100 having a thickness of approximately 1500 nm. In this state, the annealing step described above in connection with FIG. 1b is carried out for the purpose of activating the dopant in the $n^+$-type emitter region (e.g. 980° C., 5s). In this case, the dopant diffuses from the monocrystalline $n^+$-type emitter region 60b a few nm into the underlying Si cap 34 in order to form the monocrystalline emitter region 31 not depicted in FIG. 2g (cf. FIG. 1b). FIG. 2g shows the completed DPSA transistor, additionally provided with W contacts 96, 97, 98 to which lines 110, e.g. made of AlCu, are connected.

FIGS. 3a–g are schematic illustrations of the method steps of a third embodiment according to the invention of the method for the production of a DPSA transistor.

The third embodiment is a DPSA transistor produced by means of whole-area differential SiGe epitaxy.

A known production method for the DPSA transistor produced by means of whole-area differential SiGe base epitaxy is described thoroughly in WO 02/061843 A1. The most important production steps for understanding the third embodiment, beginning with the selective base deposition, are explained here.

From the embodiments illustrated in WO 02/061843 A1 the third embodiment corresponds to the example shown in FIGS. 10 to 13 therein with an inner spacer in the emitter window. A schematic cross-sectional view of a similar transistor structure is also illustrated in the recent literature (see e.g. B. Jagannathan et al., IEEE Electron Device Letters, Vol. 23, 2002, pp. 258–260).

Figure 3A:
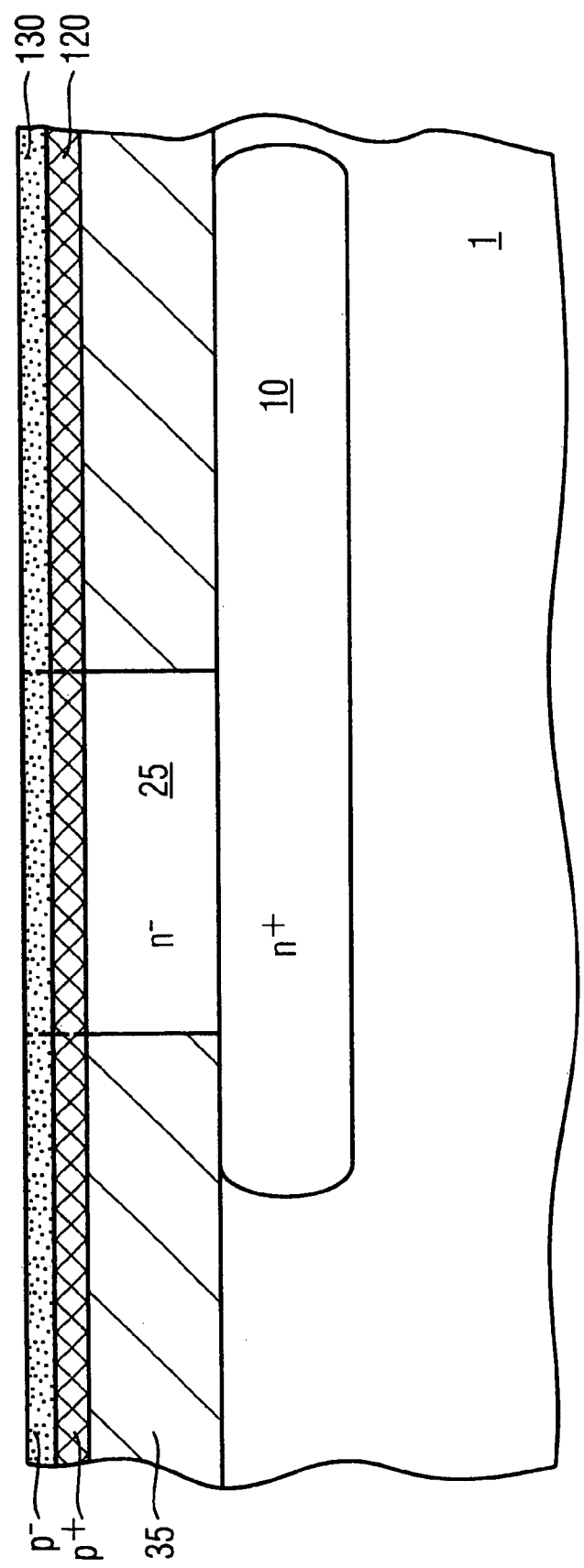

On the CVD insulation oxide region 35 with the embedded $n^-$-type collector 25 as already described in the second exemplary application, in accordance with FIG. 3a, there are deposited in a CVD reactor, by means of whole-area differential SiGe/Si epitaxy, the p$^+$-doped SiGe base layer 120 and subsequently the lightly doped Si cap layer 130 with a thickness of between 10 and 40 nm. In the same way as in the first exemplary application, the SiGe layer 120 is provided with a C concentration of between $1 \cdot 10^{18}$ cm$^{-3}$ and $1 \cdot 10^{20}$ cm$^{-3}$ during this deposition. During the deposition, the layers 120, 130 grow in monocrystalline fashion on the bare silicon region of the n$^-$-type collector 25 and in polycrystalline fashion on the oxide regions 35 (broken line in FIG. 3a). The lightly doped Si cap layer 130 may be either n$^-$- or p$^-$-doped in this case.

In accordance with FIG. 3b, there are then deposited over the whole area a thin CVD oxide layer 140 and a nitride layer 150 above the latter. By means of a phototechnology, the nitride layer 150 is patterned anisotropically on the active transistor zone selectively with respect to the underlying CVD oxide layer 140. The nitride mask thus produced on the CVD oxide layer 140 defines the later emitter window F.

Afterward, referring to FIG. 3c, the CVD oxide layer 140 is removed wet-chemically in the zones not covered by the nitride mask 150. In the exemplary embodiment in WO 02/061843 A1, the bare lightly doped p$^-$-type Si cap layer 130 is now removed wet-chemically and selectively with respect to the p$^+$-doped SiGe base layer 120. This step is not necessary in the present exemplary embodiment since said layer can also be redoped by outdiffusion from the p$^+$-type base terminal that is to be provided later. By way of example, the emitter activation thermal step may be used for this purpose or it is possible to carry out an additional thermal step prior to the later application of the n$^+$-doped emitter layer. In this case, the carbon (C) introduced into the SiGe base layer 120 protects the latter against an outdiffusion.

In this exemplary embodiment, the bare lightly doped p$^-$-type Si cap layer 130 is thinned wet-chemically from e.g. 20 nm to 10 nm, so that said redoping is effected reliably and without addition process complexity e.g. by means of the later emitter activation thermal step. On the regions not covered by the nitride mask, as shown in FIG. 3c, in a CVD reactor the base terminal 160 is now deposited with a thickness of 100–200 nm in a manner p$^+$-doped (>1×10$^{20}$ cm$^{-3}$) in situ by means of selective epitaxy.

In this case, it grows in monocrystalline fashion on the monocrystalline regions of the p$^-$-type Si cap layer 130 and in polycrystalline fashion on the polycrystalline regions of the p$^-$-type Si cap layer 130. By contrast, no growth takes place on the nitride mask 150 under these selective deposition conditions. The next step is deposition of a CVD oxide layer 170 with a thickness of e.g. 200 nm over the whole area.

Figure 3D:
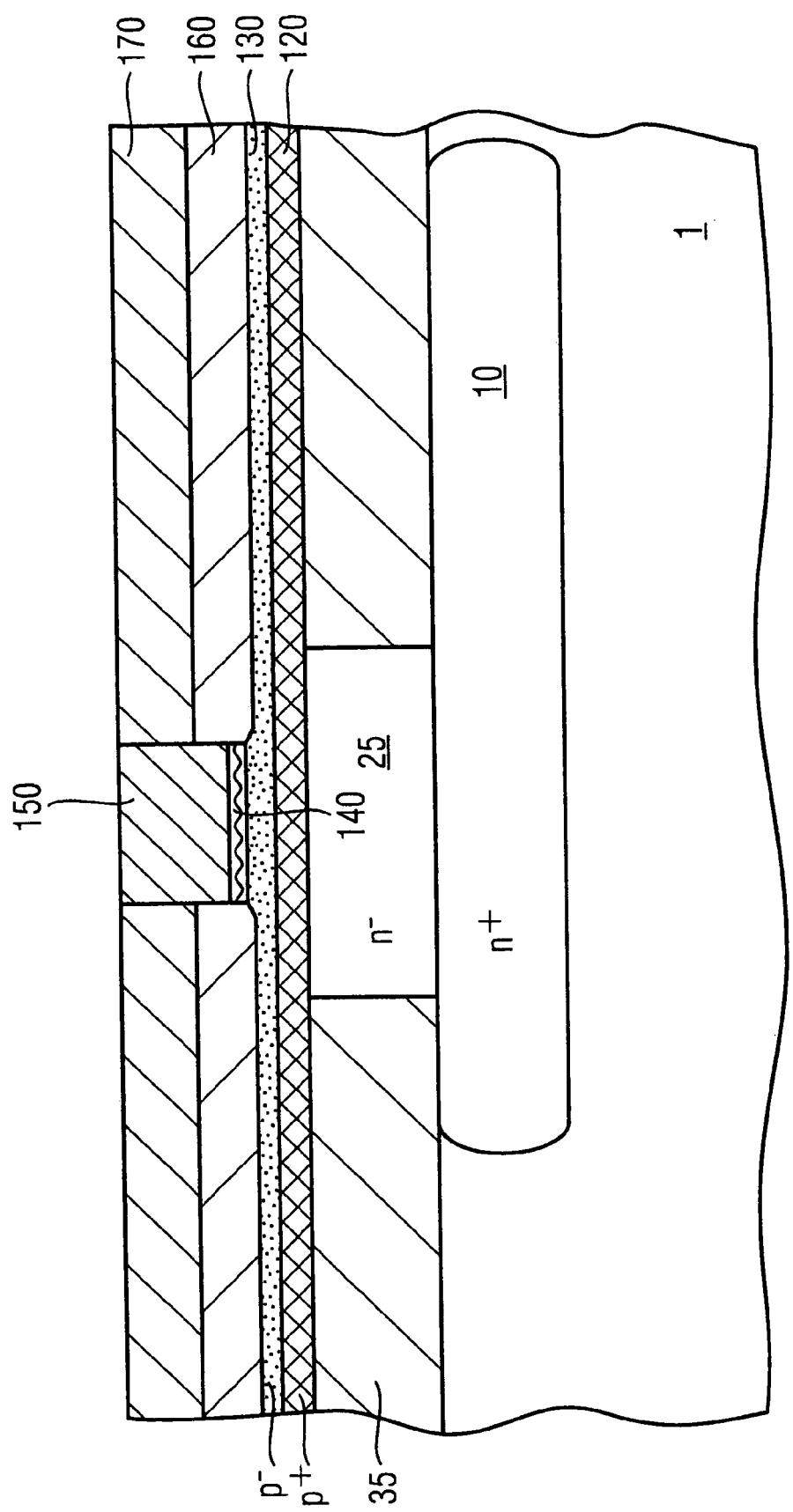

The structure thus produced is planarized by means of a CMP step (CMP=chemical mechanical polishing), thereby uncovering the nitride mask 150 in the emitter window F, as shown in FIG. 3d.

Afterward, the base terminal 160 surrounding the DPSA transistor including the CVD oxide layer 170 covering it, the underlying p$^-$-type Si cap layer 130 and the underlying p$^+$-type SiGe base layer 120 are patterned anisotropically by means of a phototechnology. Next, the nitride mask 150 in the emitter window F is removed wet-chemically or dry-chemically selectively with respect to the underlying CVD oxide layer 140, and a spacer 180 preferably made of nitride is provided in a known manner on the sidewalls of the p$^+$-doped base terminal 160 and the CVD oxide layer 170 covering the latter. Such a spacer 180' is in each case also provided on the uncovered outer side of the layers 120, 130, 160, 170 in the same step. The corresponding process state is shown in FIG. 3e.

In accordance with FIG. 3f, by means of a wet etching, the CVD oxide layer is now removed at the bottom of the emitter window F, thereby uncovering the p$^-$-type Si cap layer 130 in the emitter window F.

Figure 3G:
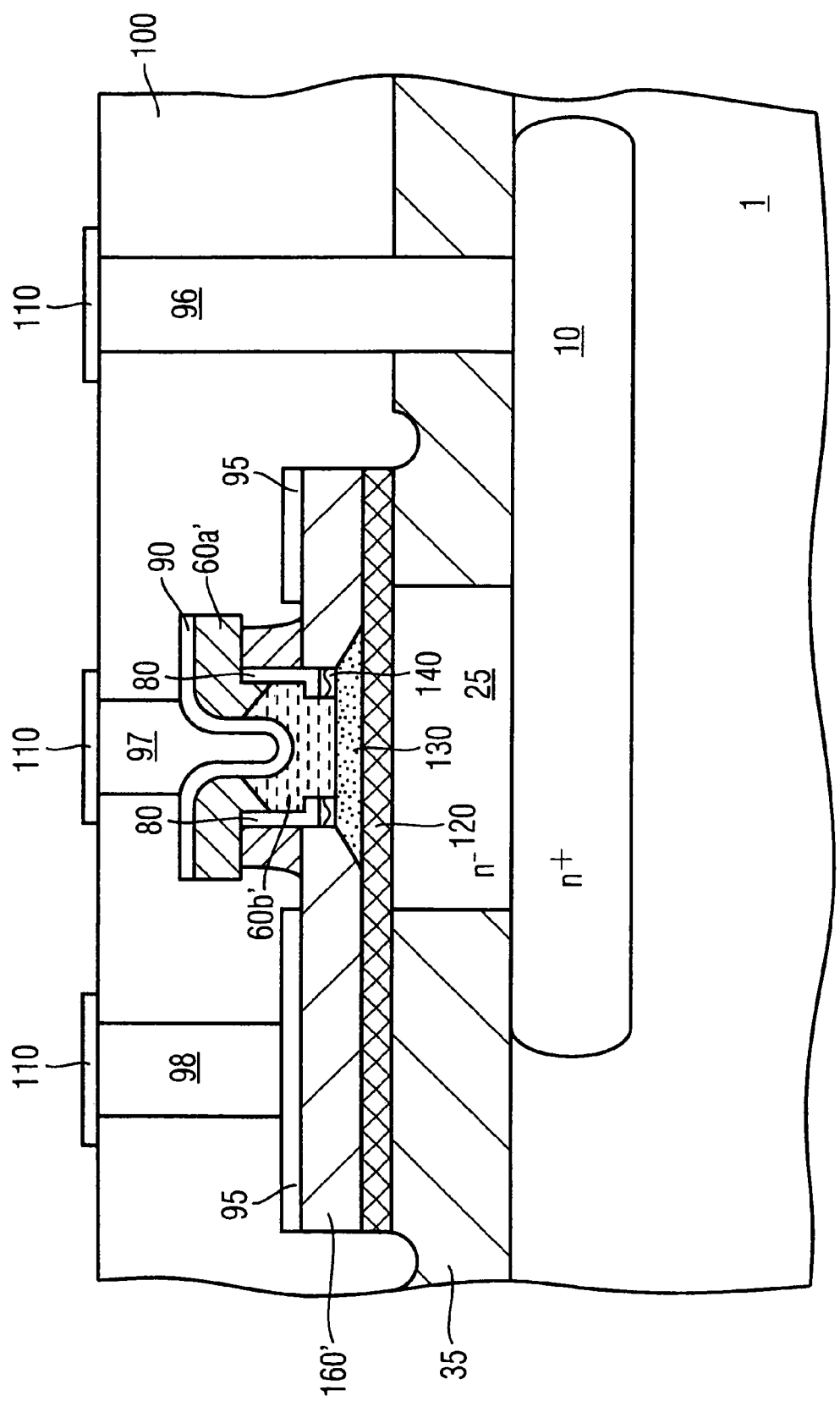
Figure 4:
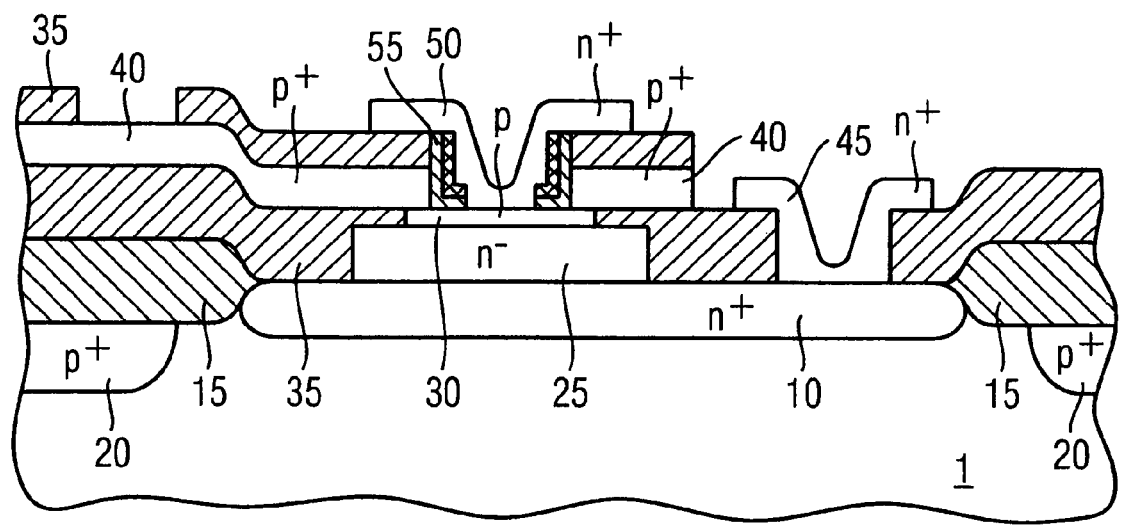
FIG. 4 shows a schematic illustration of a known DPSA transistor.

As already described in the second exemplary embodiment, the n$^+$-doped emitter layer 60a, b is then deposited in monocrystalline fashion by means of a differential epitaxy on the active transistor region and in polycrystalline fashion on the surrounding region. The further process steps for completing this DPSA transistor produced by means of whole-area SiGe base deposition are identical to the second exemplary embodiment as described in FIGS. 2e–g. The finished DPSA transistor structure in the accordance with the second embodiment is illustrated in FIG. 3g, wherein 160' designates the outdiffused base terminal region.

LIST OF REFERENCE SYMBOLS

25 Collector region
30 Base region
35, 35', 35" Oxide layer
40, 160, 160' Base terminal region
55', 80, 180, 180' Oxide sidewall spacer
60a, b Monocrystalline, polycrystalline
60a', b' emitter
F Emitter window
1 Silicon substrate
10 Subcollector region
70, 71 Nitride layer
71a Nitride sidewall spacer
U Overhang
32, 120 Base foundation layer
34, 130 Base cap layer
90 Nitride mask
M Photomask
100 Intermediate dielectric
96, 97, 98 Contacts
110 Wiring
95 Silicide
140 Oxide layer
150 Nitride layer
170 Oxide layer

What is claimed is:

1. A method for the production of a bipolar transistor having the steps of:
   (a) providing a semiconductor substrate with a collector region of a first conduction type embedded therein, said collector region being bare toward the top;
   (b) providing a monocrystalline base foundation region of the second conduction type and an optional monocrystalline base cap region of the first or second conduction type as a base region above the collector region;
   (c) providing a base terminal region of the second conduction type above the base region;
   (d) providing a first insulation region above the base terminal region;
   (e) forming a window in the insulation region and base terminal region for the purpose of at least partly uncovering the base region;
   (f) providing a first insulating sidewall spacer in the window for the purpose of insulating the base terminal region;

(g) removing a natural oxide in the uncovered base region;

(h) depositing differentially and patterning an emitter layer which forms a monocrystalline emitter region above the base region and a polycrystalline emitter region above the first insulation region and the first sidewall spacer; and (i) carrying out a heat treatment step for the purpose of partly driving the crystalline emitter region into the base region and for the purpose of forming an enlarged crystalline emitter region.

2. The method as claimed in claim 1, wherein carbon is incorporated into the emitter layer.

3. The method as claimed in claim 1, wherein the heat treatment step is a rapid annealing step, preferably a lamp annealing step.

4. The method as claimed in claim 1, wherein a second insulation region is provided between the collector region and the base terminal region and is opened by means of a wet-chemical etching in the window before the base region is formed selectively in the emitter window on the collector region.

5. The method as claimed in claim 1, wherein the base region is deposited over the whole area of the semiconductor substrate with a collector region embedded therein, said collector region being bare toward the top, a mask region is formed above the base region in accordance with the later emitter window, said mask region being embedded in the base terminal region and the overlying first insulation region, after which the window is formed.

6. The method as claimed in claim 5, wherein the base terminal region is grown above the base region by means of selective epitaxy in a manner doped in situ.

7. The method as claimed in claim 5, wherein the mask region has an oxide layer and an overlying nitride layer, the nitride layer is removed during the formation of the window, the first sidewall spacer is formed in the window on the oxide layer, and then the oxide layer is opened by means of a wet-chemical etching.

8. The method as claimed in claim 5, wherein the base region 130) has a lower, more highly doped first base foundation layer and an upper, more lightly doped base cap layer, above which the base terminal region is provided, the base cap layer being doped upward during the heat treatment step from the base terminal region.

9. The method as claimed in claim 7, wherein the base cap layer is thinned after the formation of the mask region.

10. The method as claimed in claim 1, wherein the removal of the natural oxide in the uncovered base region takes place in an epitaxy reactor by means of a heat treatment in a hydrogen atmosphere and the differential deposition of the emitter layer is subsequently carried out in situ in the epitaxy reactor.

* * * * *